United States Patent
Fasano et al.

(10) Patent No.: US 9,360,644 B2
(45) Date of Patent: Jun. 7, 2016

(54) LASER DIE AND PHOTONICS DIE PACKAGE

(71) Applicant: International Business Machines Corporation, Armonk, NY (US)

(72) Inventors: Benjamin V. Fasano, New Windsor, NY (US); Paul F. Fortier, Richelieu (CA)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 14/480,461

(22) Filed: Sep. 8, 2014

(65) Prior Publication Data

US 2016/0070061 A1  Mar. 10, 2016

(51) Int. Cl.
| | |
|---|---|
| *G02B 6/12* | (2006.01) |
| *G02B 6/26* | (2006.01) |
| *H01L 21/00* | (2006.01) |
| *G02B 6/43* | (2006.01) |
| *G02B 6/122* | (2006.01) |
| *G02B 6/13* | (2006.01) |

(52) U.S. Cl.
CPC .. *G02B 6/43* (2013.01); *G02B 6/12* (2013.01); *G02B 6/122* (2013.01); *G02B 6/12004* (2013.01); *G02B 6/13* (2013.01); *G02B 2006/12121* (2013.01)

(58) Field of Classification Search
CPC ...... G02B 6/12; G02B 6/12004; G02B 6/122; G02B 6/13; G02B 6/12121; G02B 6/42; G02B 6/43; H01S 5/026
USPC .................. 385/14, 50, 52, 129–132; 438/25, 438/31–33, 462; 257/E21.002
See application file for complete search history.

(56) References Cited

U.S. PATENT DOCUMENTS

| | | | |
|---|---|---|---|
| 6,261,858 B1* | 7/2001 | Kitaoka | G02B 6/12004 438/25 |
| 6,326,244 B1 | 12/2001 | Brooks et al. | |
| 6,330,377 B1 | 12/2001 | Kosemura | |
| 6,955,481 B2 | 10/2005 | Colgan et al. | |
| 7,084,496 B2 | 8/2006 | Benner et al. | |
| 7,329,054 B1 | 2/2008 | Epitaux et al. | |
| 8,680,684 B2 | 3/2014 | Haba et al. | |
| 2012/0207426 A1 | 8/2012 | Doany et al. | |
| 2012/0213239 A1 | 8/2012 | Ju et al. | |
| 2013/0248816 A1 | 9/2013 | Chu et al. | |

OTHER PUBLICATIONS

Z. Tang et al., "Advanced Packaging of Optoelectronic Devices," Wiley Encyclopedia of Electrical and Electronics Engineering, Published Online: Jan. 18, 2013, onlinelibrary.wiley.com/doi/10.1002/047134608X.W8193/pdf, downloaded Mar. 26, 2014, 27 pages.

* cited by examiner

*Primary Examiner* — Akm Enayet Ullah
*Assistant Examiner* — Michael Mooney
(74) *Attorney, Agent, or Firm* — Matthew C. Zehrer

(57) ABSTRACT

A multi semiconductor device package includes a laser die and a photonics die. The laser die generates light and includes a laser facet that emits light from a light emitting surface. The photonics die modulates light emitted from the laser light emitting surface and includes a device side cavity that exposes an embedded waveguide optically connected with the laser facet. A laser die and photonics die attachment method includes positioning a device side of the laser die relative to a device side of the photonics die, engaging an alignment feature of the photonics die with an alignment feature of the laser die, installing the laser die within a device side recess of photonics die, electrically connecting the laser die with the photonics die, and optically connecting a laser facet of the laser die with an embedded waveguide of the phonics die.

18 Claims, 7 Drawing Sheets

LASER DIE AND PHOTONICS DIE PACKAGE

FIELD

Embodiments of invention generally relate to semiconductor devices and semiconductor device packaging. More particularly, embodiments relate to attaching a laser die with a photonics die to create a laser die and photonics die package.

BACKGROUND

Semiconductor Photonics is the study and application of photonic systems which use a semiconductor, such as silicon, as an optical medium. The semiconductor is usually patterned with sub-nanometer precision, into components that may operate in the infrared wavelengths, used by most fiber optic telecommunication systems. The semiconductor typically lies on top of a layer of silica, also known as silicon on insulator (SOI) fabrication, and is packaged into a photonics die.

The photonics die receives light from a continuous wavelength laser. This laser light source can be either physically attached to the photonics die delivering light directly to the phonics die or be positioned separate from the die. When off-die lasers are used, light from the laser can be fed into the photonics die by the use of glass fibers or other waveguide materials such as a polymer. Light thus introduced into the photonics die waveguide input becomes encoded data, by electronically modulating the light in the form of optical pulses. The optical pulses pass through additional optical components and finally to a waveguide output that may transmit, light pulse data to an adjacent optically connected device or a different photonics system.

SUMMARY

In an embodiment of the present invention, a multi semiconductor device package includes a laser die and a photonics die. The laser die generates light and includes a laser facet that emits light from a light emitting surface. The photonics die modulates light emitted from the light emitting surface and includes a device side embedded waveguide optically connected with the laser facet.

In another embodiment of the present invention, a design structure tangibly embodied in a machine readable storage medium for designing, manufacturing, or testing a multi semiconductor device package includes the laser die and photonics die.

In another embodiment of the present invention, a laser die and photonics die attachment method includes positioning a device side of the laser die relative to a device side of the photonics die, engaging an alignment feature of the photonics die with an alignment feature of the laser die, installing the laser die within a device side recess of the photonics die, electrically connecting the laser die with the photonics die, and optically connecting a laser facet of the laser die with an embedded waveguide of the phonics die.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented.

Various embodiments of invention relate to semiconductor devices and semiconductor device packaging, and specifically relate to attaching a laser die with a photonics die. The photonics die may include a recess and an embedded waveguide. The recess allows an optical output of the laser die to optically connect with the embedded waveguide when the laser die is positioned and attached to the photonics die.

Referring now to the figures, wherein like components are labeled with like numerals, exemplary embodiments of the present invention are shown and will now be described in greater detail below. It should be noted that while this description may refer to some components in the singular tense, more than one component may be depicted throughout the figures. The specific number of components depicted in the figures and the cross section orientation was chosen to best illustrate the various embodiments described herein.

Figure 1:
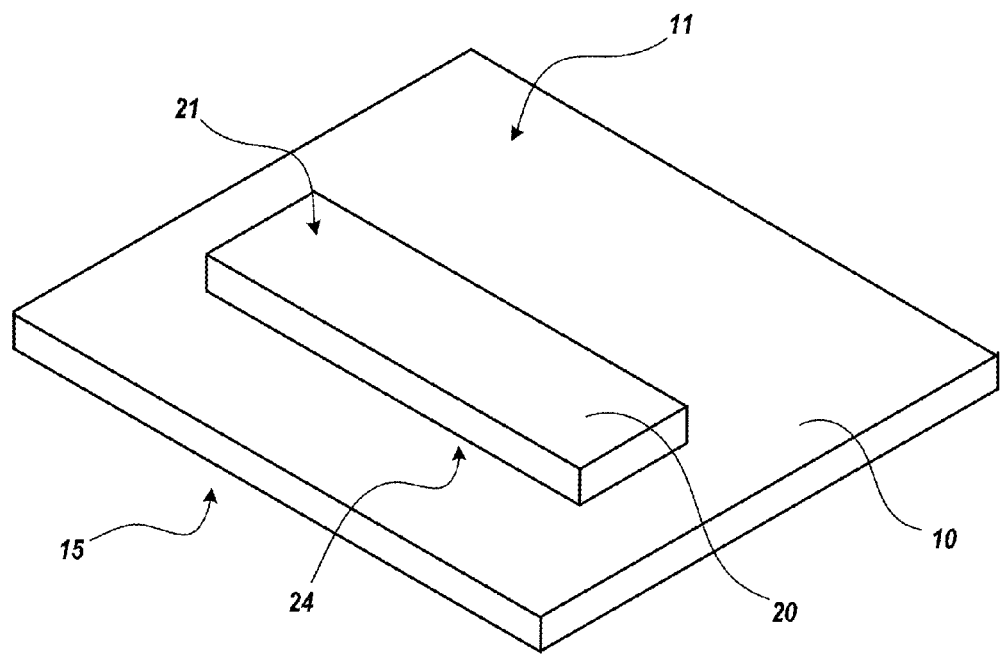
FIG. 1 depicts an exemplary laser die attached with an exemplary photonics die, in accordance with various embodiments of the present invention.

FIG. 1 depicts a laser die 20 attached with a photonics die 10, in accordance with various embodiments of the present invention, that forms a laser die 20 and photonics die 10 package. Generally, laser die 20 is electrically connected and optically connected with photonics die 10. Electrically connected shall mean that electrical current is capable from passing from laser die 20 to photonics die 10. Likewise, optically connected shall mean that light is capable from passing from laser die 20 to photonics die 10. Photonics die 10 receives light from laser die 20 with a waveguide that is embedded below the device side surface 11 of photonics die 10. Photonics die 10 encodes data by modulating the light into optical pulses. The optical pulses pass through a waveguide output and may be transmitted by an optical cable connected to the photonics system or a different photonics system. In various embodiments, a device side surface 24 of laser die 20 is attached with the device surface 11 of photonics die 10.

The photonics die 10 and laser die 20 may be included in a data handling system, computer, etc. Exemplary major components of such system may include one or more processors, a main memory, a terminal interface, a storage interface, an I/O (Input/Output) device interface, and a network adapter, all of which are communicatively coupled, directly or indirectly, for inter-component communication via a bus. In a particular implementation the photonics die 10 may be communicatively connected to the bus to receive data from the processor. The photonics die 10 may modulate the received data into light pulses that may be sent via an optical network adapter, optical cable, etc., to a receiving data handling system. A photonics die 10 within the receiving data handling system may receive the optical pulses and modulate the light pulses back to the data for further data processing (e.g. storage within the receiving data handling system, etc.).

Figure 2:
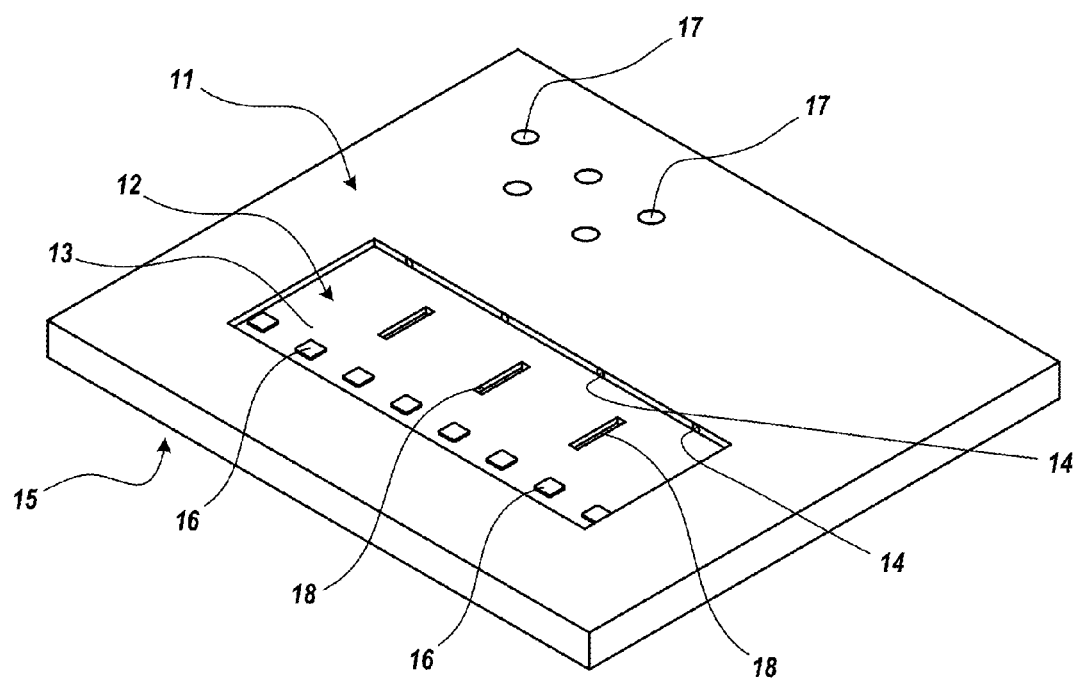
FIG. 2 depicts an exemplary photonics die, in accordance with various embodiments of the present invention.

As shown in FIG. 2, photonics die 10 may also include a recess 12, an embedded waveguide 14, a laser die contact 16, a system contact 17, and/or an alignment feature 18. Recess 12 exposes the embedded waveguide 14 such that light from the laser die 10 may optically connect thereto. In certain embodiments, the footprint of recess 12 is similar to the footprint of laser die 10. In other embodiments, the footprint of recess 12 is larger than the footprint of laser die 10. In certain embodiments, a recessed surface 13 of recess 12 is below surface 11 by 0.2-5 microns, although less than 0.2 microns and greater than 5 microns are currently contemplated. In certain preferred embodiments, recessed surface 13 is below surface 11 by 1-2 microns.

Embedded waveguide 14 may be e.g. a photonic waveguide, slot waveguide, rib waveguide, etc. Waveguide 14 may include a waveguide region adjacent p-and n- doped regions generally positioned below surface 11 of photonics die 10. P region and N region contacts essentially form terminals of a p-i-n diode, between the waveguide region. Electrical current may be provided to the electrical contacts to alter the optical properties of the waveguide region. Such alterations may provide for the modulation of light provided by laser die 10 into light pulses. In certain embodiments, photonics die 10 includes a single or multiple embedded waveguides 14.

Contact 16 generally enables electrical current to be provided from photonics die 10 to laser die 20. For example, an interconnect (e.g. wire, etc.) may be attached to contact 16 and attached to laser die 20 to allow electrical current be provided from photonics die 10 to laser die 20. In certain embodiments, contacts 16 may be metal, copper, gold, etc. pads. In some embodiments, contact 16 may be positioned upon recessed surface 13. In other embodiments, contact may be positioned upon device surface 11. Contact 17 generally enables electrical current to be provided from e.g. the data handling system, computer, etc. to photonics die 10. For example, contact 17 may allow for photonics die 10 to electrically connect with a carrier or substrate which in turn is electrically connected with a system board of the computer. In certain embodiments, contact may be a controlled collapse chip connection (C4) contact. For example, contacts 17 may be pads metalized on surface 10 subsequent to integrated circuits (e.g. the PIN diodes, etc.) being created within photonics die 10. Solder dots may be deposited upon each of the metalized pads and utilized to connect with external circuitry (e.g. carrier, substrate, system board, etc.). Contact 17 may be positioned upon device surface 11 of photonics die 20.

Alignment feature 18 is utilized to position laser die 20 during installation with photonics die 10 such that the light emitting edge of laser die 20 optically connects with embedded waveguide 14 when laser die 20 is attached to photonics die 10. In certain embodiments, as shown in FIG. 2, alignment feature 18 may be a receptacle that accepts a protrusion of laser die 20. In other embodiments, alignment feature 18 may be a protrusion accepted by a receptacle of laser die 20. Photonics die 20 may include a single alignment feature 18 or multiple alignment features 18.

In certain embodiments, a backside 15 of photonics die 10 may be in thermal contact with a heat dissipating device (e.g. heat sink, thermal interface material, etc.) to remove heat from photonics die 10. For example, heat generated by laser die 20 may flow generally from device side 24 of laser die 20, transfer to photonics chip 10 and flow generally from device side 11 to backside 15, and transfer to the heat dissipating device.

Figure 3:
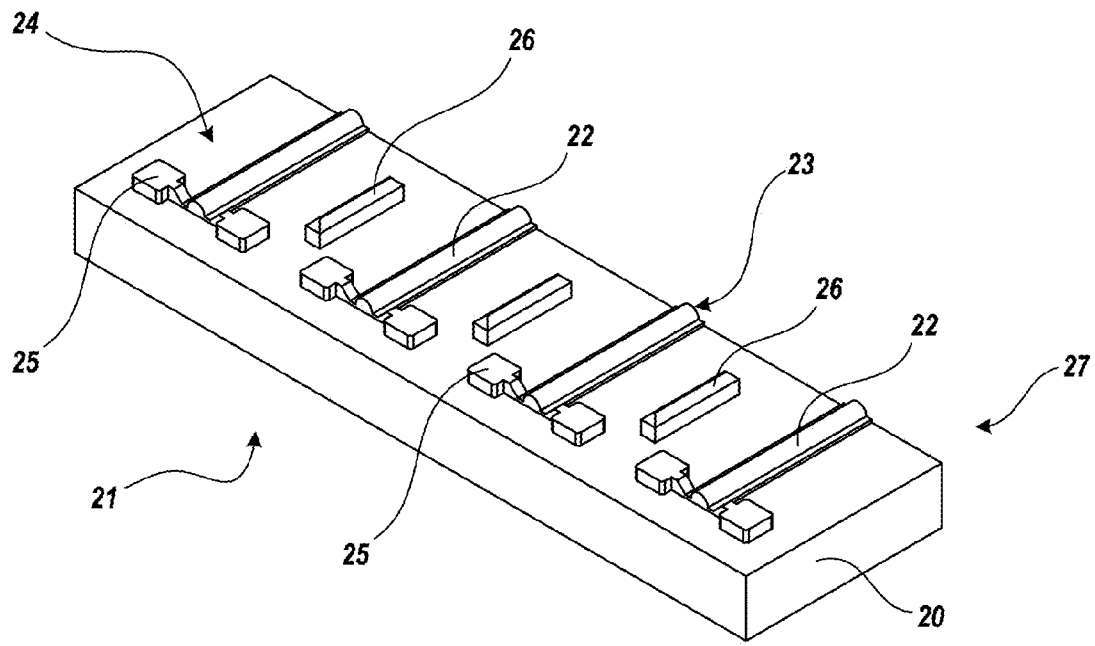
FIG. 3 depicts an exemplary laser die, in accordance with various embodiments of the present invention.

As shown in FIG. 3, laser die 20 may include a lasing cavity 22, an optical edge emitter surface or facet 23, contacts 25, and/or alignment feature 26. Generally, laser die 20 is the source of light to photonics die 10. In certain embodiments, laser die 20 may be a bare laser die often referred to as a distributed feedback laser, a laser diode chip, etc. The light generated by laser die 20 may be transferred to a light emitting edge 27 and emitted at facet 23. For example, light generated from a light generating element (e.g. laser, etc.) is optically connected (e.g. light transfer may occur, etc.) to facet 23 at the light emitting edge 27.

Laser die 20 may produce various wavelengths of light. The various wavelengths of light may be transferred to photonics die 20 by a single facet 23 or by multiple facets 23. If multiple lasers and facets 23 are utilized, a single wavelength of light may be associated with each laser cavity 22 and laser facet 23. In certain embodiments, laser die 20 may include one, two, four, etc. cavities 22 and facets 23.

Facet 23 transmits light generated by laser die 20 to light emitting edge 27. Facet 23 may be positioned upon device side 24 of laser die 20. In certain embodiments, a light emitting surface of facet 23 is coplanar with light emitting edge 27 of laser die 20. Contact 25 generally enables electrical current to be provided from photonics die 10 to laser die 20. For example, an interconnect (e.g. wire, etc.) may be attached to contact 25 and attached to photonics die 10 to allow electrical current be provided from photonics die 10 to laser die 20. In certain embodiments, contacts 25 may be metal, copper, gold, etc. pads. In certain embodiments, contact 25 is electrically connected to the light generating element to provide current for the generation of light. In certain embodiments, multiple (e.g. two, etc.) contacts 25 are electrically connected to the light generating element to provide for e.g. an electrical input and output for the generation of light. Generally, the one or more contacts 25 may be positioned upon device side 24 of laser die 20.

Alignment feature 26 is utilized to position laser die 20 during installation with photonics die 10 such that facet 23 optically connects with embedded waveguide 14 when laser die 20 is attached to photonics die 10. In certain embodiments, as shown in FIG. 3, alignment feature 26 may be a protrusion accepted by a receptacle of photonics die 10. In other embodiments, alignment feature 26 may be a receptacle that accepts a protrusion of photonics die 20. Laser die 10 may include a single alignment feature 26 or multiple alignment features 26. In certain embodiments, facet 23 may be optically connected with a respective waveguide 14 by butt coupling, adiabatic coupling, etc.

Figure 4:
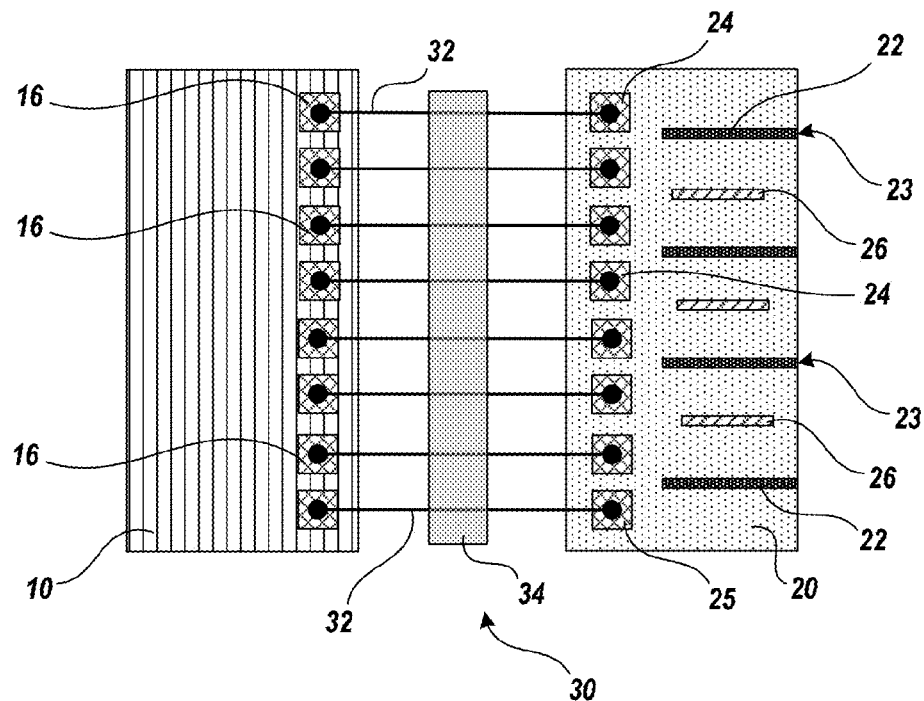
FIG. 4-FIG. 8 depicts exemplary electrical interconnection of an laser die with an photonics die, in accordance with various embodiments of the present invention.

FIG. 4-FIG. 8 depict exemplary electrical interconnections of laser die 20 with photonics die 10, in accordance with various embodiments of the present invention. As shown in FIG. 4, photonics die 10 and laser die 20 may be electrically interconnected by a ribbon wire 30. Ribbon wire 30 may include one or more wires 32 within a ribbon 34. Ribbon 34 may separate multiple wires 30, provide for improved usability or handling, etc. In some embodiments, ribbon 34 may be omitted and photonics die 10 and laser die 20 may be electrically interconnected by one or more wires 32. The one or more wires 32 may electrically connect contact 16 and contact 25, respectively. For example, a wire 32 may be soldered (e.g. Lead free solder, etc.) to contact 16 and to contact 24 to electrically interconnect photonics die 10 and laser die 20. Alternatively, the wire may be wirebonded to contact 16 and/or contact 25, respectively.

Figure 5:
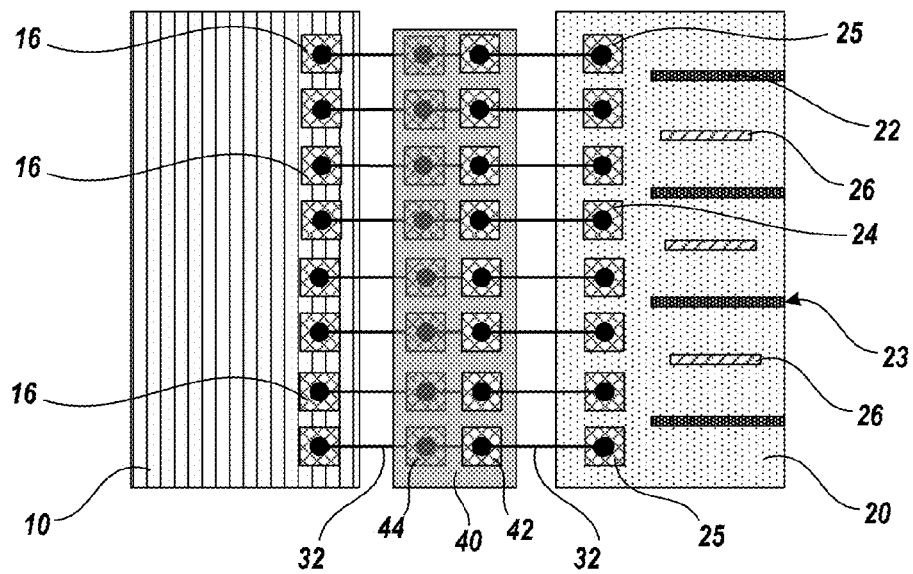
Figure 6:
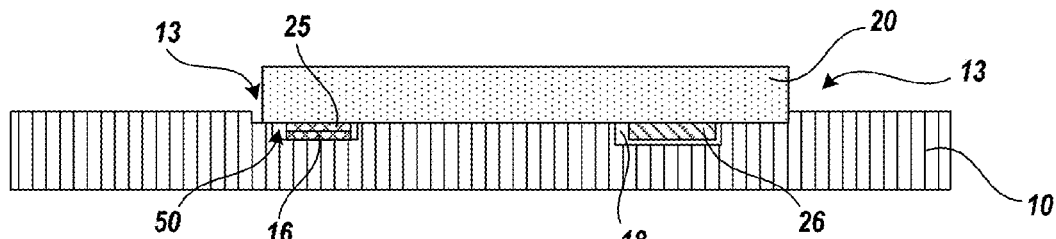
Figure 7:
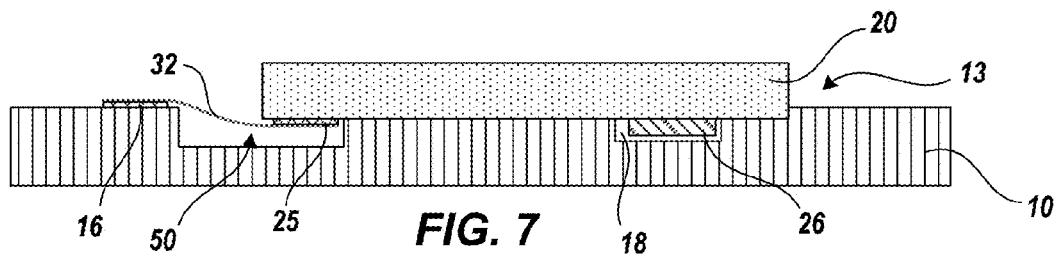
Figure 8:
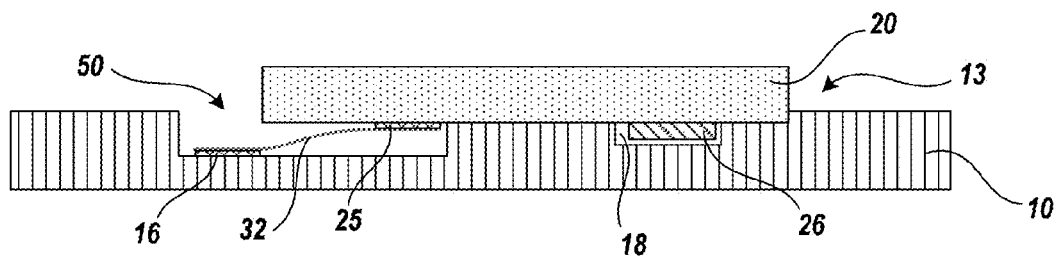

As shown in FIG. 5, photonics die 10 and laser die 20 may be electrically interconnected by an interposer 40. Interposer 40 may include a first side having one or more contacts 42 and a second side having one or more contacts 44. Contact(s) 42 and contact(s) 44 are electrically interconnected by an electrical conducting material within interposer 40. Laser die 20 may be electrically interconnected to interposer 40 by connecting one or more wires 32 with contact 25 and with contact 42. Photonics die 10 may be electrically interconnected to interposer 40 by connecting one or more wires 32 with contact 16 and with contact 44. For example, a first wire 32 may be soldered to contact 16 and to contact 25 and a second wire 32 electrically connected to the first wire 32 may be soldered to contact 42 and to contact 25 to electrically interconnect photonics die 10 and laser die 20. As shown in FIG. 6, photonics die 10 and laser die 20 may be electrically interconnected by interconnecting contact 16 with contact 25. Contact 16 may be positioned within cavity 50 of photonics chip to allow for the interconnection of contact 16 and contact 25. As shown in FIG. 7, contact 16 may be generally located upon device surface 11 of photonics die 10 and may be electrically connected with contact 25 by wire 32. In certain embodiments, cavity 50 of e.g. 50-100 microns may allow for the interconnection of contact 16 and contact 25. As shown in FIG. 8, contact 16 may be generally located upon cavity 50 surface 51 of photonics die 10 and may be electrically connected with contact 25 by wire 32 (e.g. butt coupling, adiabatic coupling, etc.). In certain embodiments, an overcoat may be applied to contact 16 and contact 25 with thermally conductive material and may provide increased thermal transfer, oxidation and humidity protection, etc.

Subsequent to the attachment of laser die 20 and photonics die 10 adhesive may be dispensed generally around laser die 20. Capillary action may draw the adhesive within the laser die 20 and photonics die interface. In certain embodiments, the adhesive may also be dispensed generally within cavity 50. The adhesive may be subsequently cured and may also provide for a thermal interface between laser die 20 and photonics die 10. In various embodiments, a force may be applied during the adhesive cure for proper attachment of laser die 20 with photonics die 10.

Figures 9, 10:
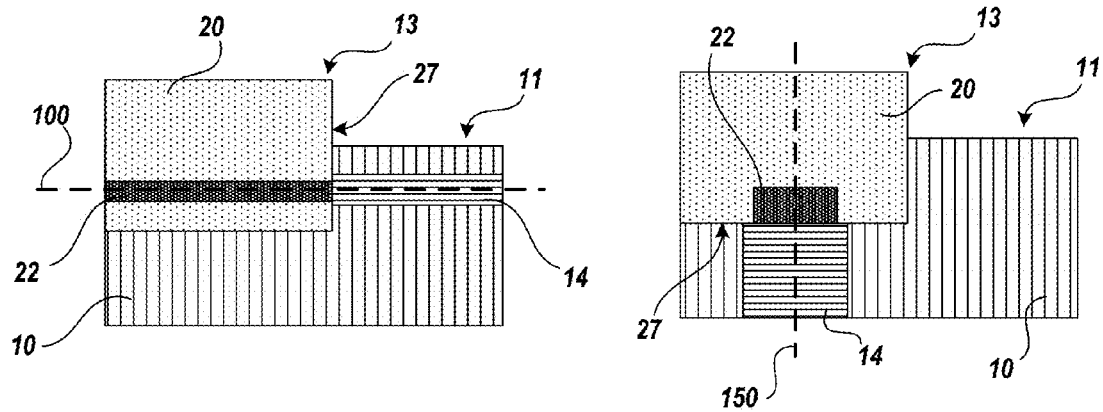
FIG. 9-FIG. 10 depicts exemplary optical interconnection of a laser die with a photonics die, in accordance with various embodiments of the present invention.

FIG. 9-FIG. 10 depict optical interconnection of laser die 20 with a photonics die 10, in accordance with various embodiments of the present invention. As shown in side cross-section view FIG. 9, when laser die 20 is attached with a photonics die 10, facet 23 may be generally aligned with embedded waveguide 14 along an axis 100 that is generally parallel with surface 11. The alignment allows for the light emitted from facet 23 at light emitting surface 27 to transfer to waveguide 14. In certain embodiments, as shown in FIG. 9, light emitting surface 27 may be orthogonal to device surface 11. As shown in FIG. 10, when laser die 20 is attached with a photonics die 10, facet 23 may be generally aligned with embedded waveguide 14 along an axis 150 that is generally orthogonal to surface 11. The alignment allows for the light emitted from facet 23 at light emitting surface 27 to transfer to waveguide 14. In certain embodiments, as shown in FIG. 10, light emitting surface 27 may be parallel with device surface 11.

Figure 11:
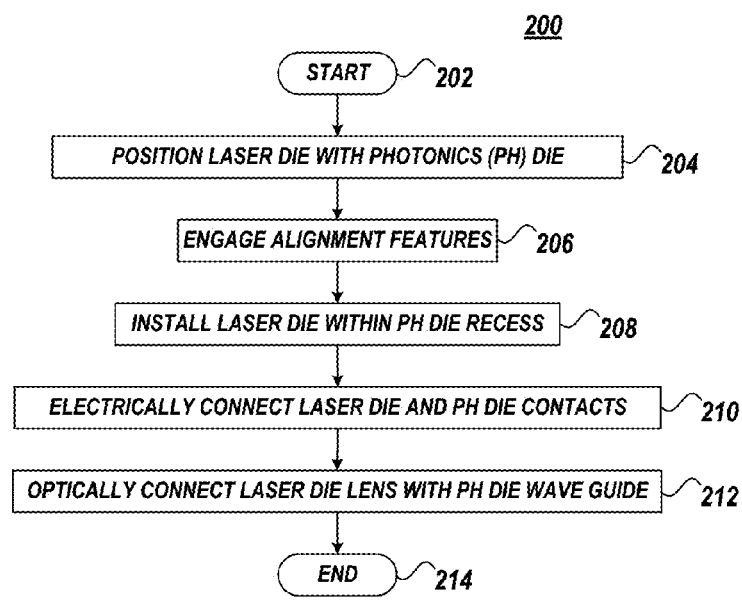
FIG. 11-FIG. 13 depicts laser die and photonics die attachment methods, in accordance with various embodiments of the present invention.

FIG. 11 depicts a laser die 20 and photonics die 10 attachment method 200, in accordance with various embodiments of the present invention. Method 200 begins at block 202 and continues with positioning laser die 20 with or otherwise upon photonics die 10 (block 204). For example, laser die 20 may be flipped such that device side 24 faces device side 11 of photonics chip 10. Method 200 may continue with engaging alignment feature 26 and alignment feature 18 (block 206). For example, a protrusion of laser die 20 may be accepted by a receptacle of photonics die 10 or visa versa. Method 200 may continue with installing laser die 20 within recess 12 of photonics die 10 (block 208). For example, a force may be applied to laser die 20 to join laser die 20 and photonics die 10. Method 200 may continue with electrically connecting contact 16 and contact 25 (block 210). For example, contact 16 may be electrically connected directly with contact 25 via a solder connection. Method 200 may continue with optically connecting facet 23 and embedded waveguide 14 (block 212). For example, facet 23 is aligned with embedded waveguide 14 along an axis 100 or 150 to allow for light transfer between laser die 20 and photonics die 10. Method 200 ends at block 214.

Figure 12:
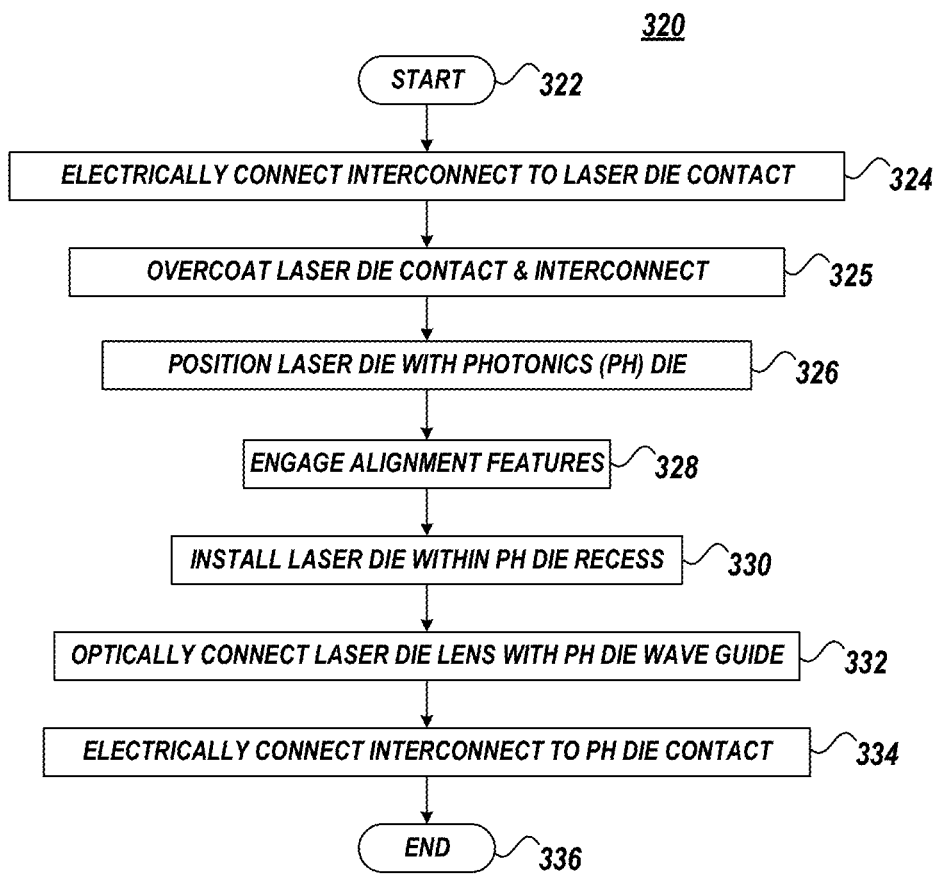

FIG. 12 depicts a laser die 20 and photonics die 10 attachment method 320, in accordance with various embodiments of the present invention. Method 320 begins at block 322 and continues with electrically connecting an interconnect to contact 25 (block 324). For example, a ribbon cable 30, an interposer 40, or a wire 32, etc. may be soldered or otherwise joined with contact 25. Method 320 may continue with applying an overcoat to the interconnect and contact 25 junction (block 325). Method 320 may continue with positioning laser die 20 with or otherwise upon photonics die 10 (block 326). Method 320 may continue with engaging alignment feature 26 and alignment feature 18 (block 328). Method 320 may continue with installing laser die 20 within recess 12 of photonics die 10 (block 330). For example, a force in a first direction may be applied to laser die 20 to join laser die 20 and photonics die 10 and a force in a second direction (e.g. toward edge emitting surface 27) may be applied such that edge emitting surface 27 contacts photonics die 10. Method 320 may continue with optically connecting facet 23 and embedded waveguide 14 (block 332). For example, with the application of the second force, facet 23 may become aligned with embedded waveguide 14 along an axis 100 or 150 to allow for light transfer between laser die 20 and photonics die 10. Method 320 may continue with electrically connecting the interconnect with contact 16 (block 334). For example, the ribbon cable 30, the interposer 40, or the wire 32, etc. may be soldered or otherwise joined with contact 25. Method 320 ends at block 214.

Figure 13:
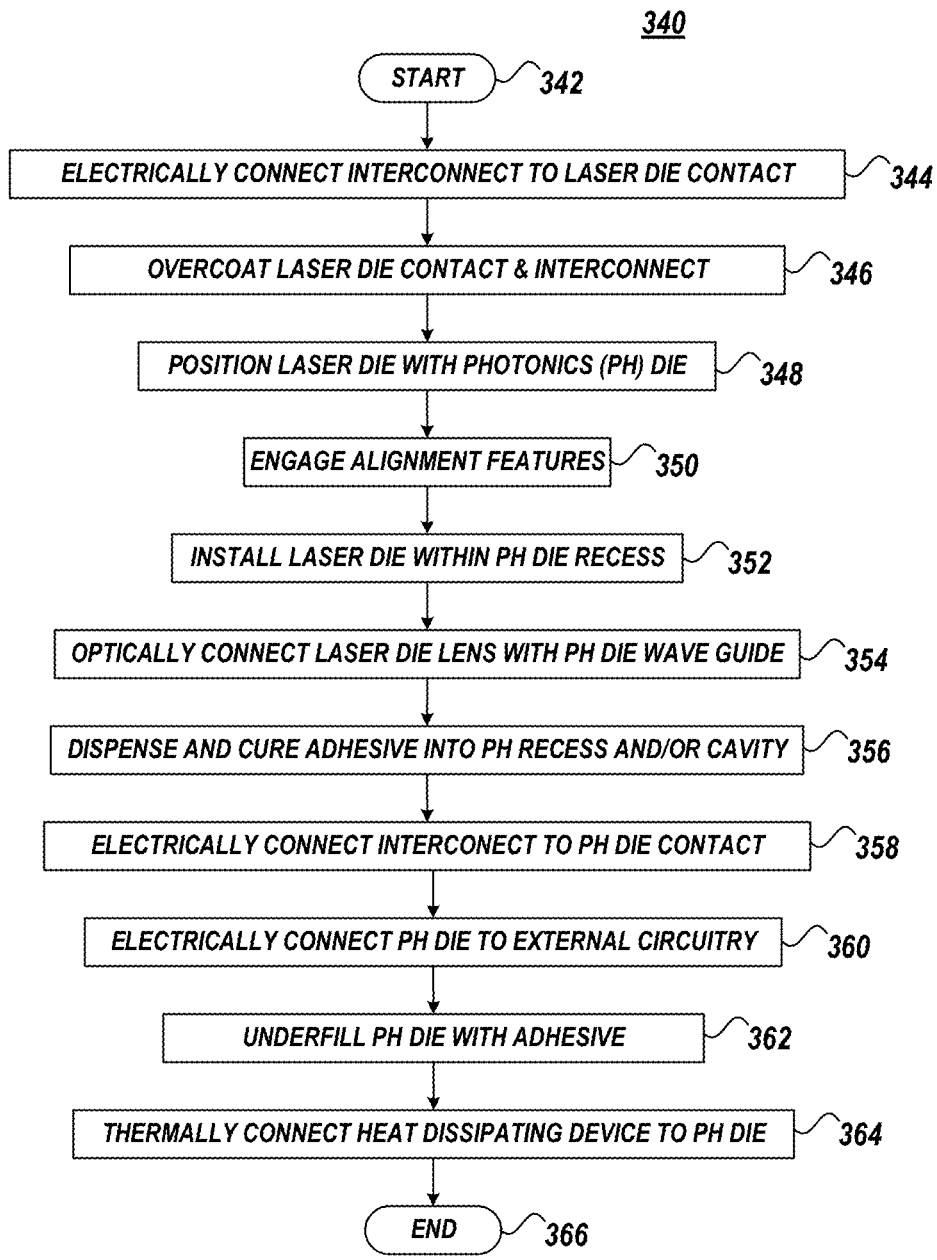

FIG. 13 depicts a laser die 20 and photonics die 10 attachment method 340, in accordance with various embodiments of the present invention. Method 340 begins at block 342 and continues with electrically connecting an interconnect to contact 25 (block 344) and may continue with applying an overcoat to the interconnect and contact 25 junction (block 346). Method 340 may continue with positioning laser die 20 with or otherwise upon photonics die 10 (block 348) and may continue with engaging alignment feature 26 and alignment feature 18 (block 350). Method 340 may continue with installing laser die 20 within recess 12 of photonics die 10 (block 352) and may continue with optically connecting facet 23 and embedded waveguide 14 (block 354). Method 340 may continue with dispensing an adhesive within recess 12 and/or cavity 50 (block 356). For example, the adhesive may be dispensed within cavity 50 and capillary action may pull the adhesive within the laser die 20 and photonics die 10 junction. The adhesive may be cured and may provide for mechanical adhesion and for a thermal interface between the photonics die 10 and laser die 20. Method 340 may continue with electrically connecting the interconnect with contact 16 (block 358). Method 340 may continue with electrically connecting contacts 17 to external circuitry (block 360). For example, photonics chip 10 may be positioned so that solder balls upon contacts 17 are facing the connectors on the external circuitry (carrier, system board, etc.). The solder may be melted, reflowed, etc. to electrically connect the photonics die 10 to the external circuitry. Method 340 may continue with underfilling the photonics die with electrically insulating adhesive (block 362). The adhesive may provide for mechanical adhesion and for a thermal interface between the photonics die 10 and external circuitry. Method 340 may continue with thermally connecting (e.g. heat transfer may occur, etc.) a heat dissipating device to photonics die 10 (block 364). For example, a thermal interface gel may be applied to backside surface 15 of photonics die 10 and a heat sink applied thereto to provide for heat transfer from laser die 20, to photonics die 10, to the heat dissipating device. Method 340 ends at block 366.

Figure 14:
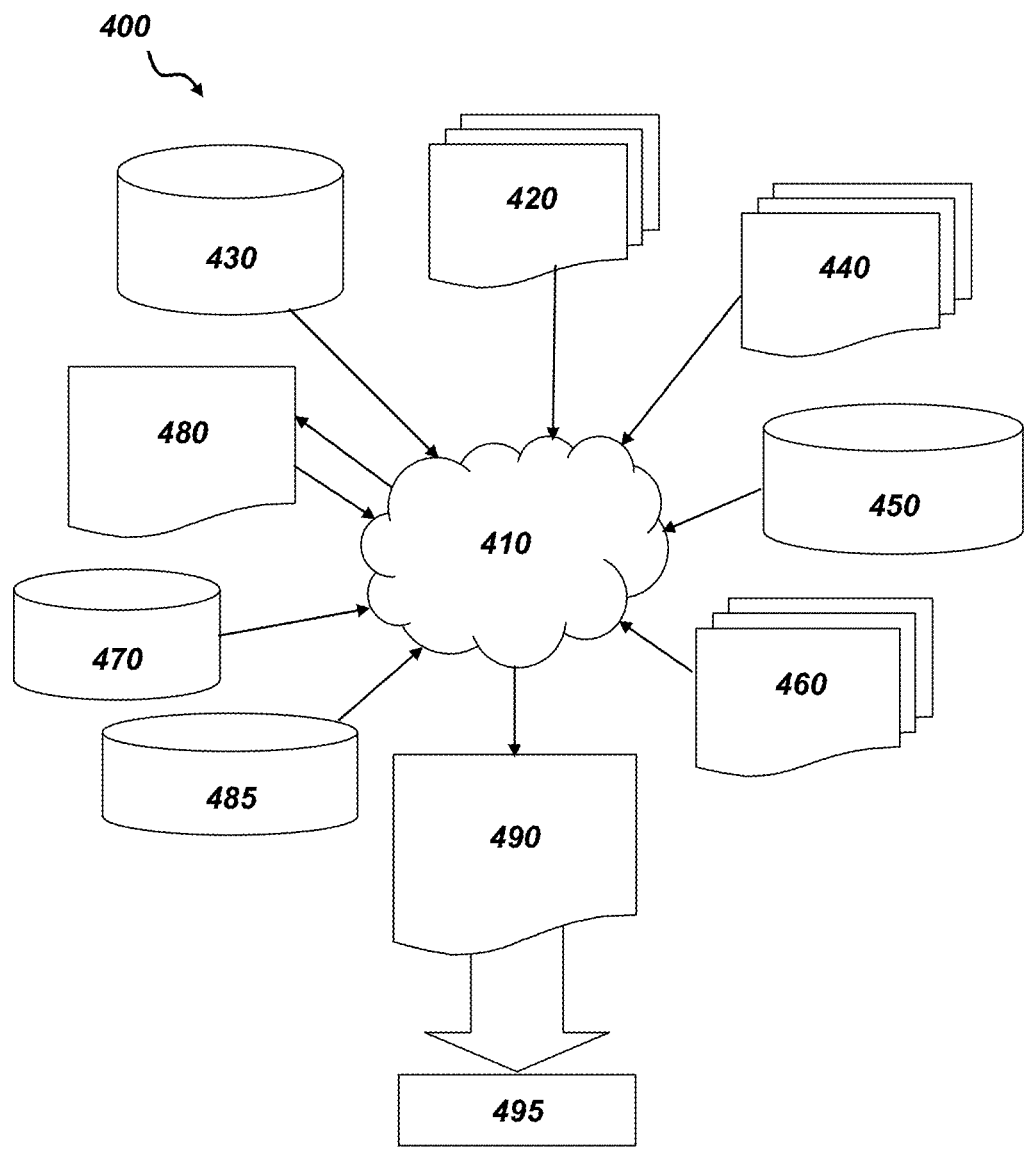
FIG. 14 depicts an exemplary semiconductor device fabrication process flow, in accordance with various embodiments of the present invention.

Referring now to FIG. 14, a block diagram of an exemplary design flow 400 used for example, in semiconductor integrated circuit (IC) logic design, simulation, test, layout, and/or manufacture is shown. Design flow 400 includes processes, machines and/or mechanisms for processing design structures or devices to generate logically or otherwise functionally equivalent representations of the structures and/or devices described above and shown in FIGS. 1-10.

The design structures processed and/or generated by design flow 400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer.

When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, structure, or system such as those shown in FIGS. 1-10. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or structures shown FIGS. 1-10 to generate a Netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 410 without deviating from the scope and spirit of the invention claimed herein. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures along with any additional mechanical design or data (if applicable), to generate a second design structure 490. Design structure 490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 490 may comprise a compiled, executable HDL simulation model that functionally simulates the devices shown in FIGS. 1-10.

Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 490 may then proceed to a stage 495 where, for example, design structure 490: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and structures described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the surface 11 of the photonics die 10, regardless of the actual spatial orientation of the photonics die. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A multi semiconductor device package comprising: a laser die that generates light, the laser die comprising a laser facet that emits light from a light emitting surface, and; a photonics die that modulates light emitted from the light emitting surface, the photonics die comprising a device side embedded waveguide optically connected with the laser facet wherein a device side of the laser die is joined to the photonics die within the device side cavity.

2. The multi semiconductor device package of claim 1, wherein the laser die further comprises one or more electrical contacts and wherein the photonics die further comprises one or more electrical contacts.

3. The multi semiconductor device package of claim 1, wherein the one or more electrical contacts of the photonics die are positioned within the device side cavity.

4. The multi semiconductor device package of claim 2, wherein the one or more electrical contacts of the laser die and the one or more electrical contacts of the photonics die are electrically connected by an interconnect.

5. The multi semiconductor device package of claim 1, wherein the laser die further comprises an alignment feature and wherein the photonics die comprises an alignment feature.

6. The multi semiconductor device package of claim 5, wherein the laser die alignment feature is a protrusion, wherein the photonics die alignment feature is a receptacle, and wherein the protrusion is accepted by the receptacle to position the laser die with the photonics die to optically connect the laser facet with the embedded waveguide.

7. The multi semiconductor device package of claim 5, wherein the laser die alignment feature is a receptacle, wherein the photonics die alignment feature is a protrusion, and wherein the protrusion is accepted by the receptacle to position the laser die with the photonics die to optically connect the laser facet with the embedded waveguide.

8. The multi semiconductor device package of claim 1, wherein the laser facet is aligned with the embedded waveguide along an axis parallel with the device side of photonics die.

9. A design structure tangibly embodied in a non-transitory machine readable storage medium for designing, manufacturing, or testing a multi semiconductor device package, the design structure comprising: a laser die that generates light, the laser die comprising a laser facet that emits light from a light emitting surface, and; a photonics die that modulates light emitted from the light emitting surface, the photonics die comprising a device side embedded waveguide optically connected with the laser facet wherein a device side of the laser die is joined to the photonics die within the device side cavity.

10. The design structure of claim 9, wherein the laser die further comprises one or more electrical contacts and wherein the photonics die further comprises one or more electrical contacts.

11. The design structure of claim 9, wherein the one or more electrical contacts of the photonics die are positioned within the device side cavity.

12. The design structure of claim 10, wherein the one or more electrical contacts of the laser die and the one or more electrical contacts of the photonics die are electrically connected by an interconnect.

13. The design structure of claim 9, wherein the laser die further comprises an alignment feature and wherein the photonics die comprises an alignment feature.

14. The design structure of claim 13, wherein the laser die alignment feature is a protrusion, wherein the photonics die alignment feature is a receptacle, and wherein the protrusion is accepted by the receptacle to position the laser die with the photonics die to optically connect the laser facet with the embedded waveguide.

15. The design structure of claim 14, wherein the laser die alignment feature is a receptacle, wherein the photonics die alignment feature is a protrusion, and wherein the protrusion is accepted by the receptacle to position the laser die with the photonics die to optically connect the laser facet with the embedded waveguide.

16. The design structure of claim 9, wherein the laser facet is aligned with the embedded waveguide along an axis parallel with the device side of photonics die.

17. A laser die and photonics die attachment method comprising:
   positioning a device side of the laser die relative to a device side of the photonics die;
   engaging an alignment feature of the photonics die with an alignment feature of the laser die;
   installing the laser die within a device side recess of the photonics die;
   electrically connecting the laser die with the photonics die, and;
   optically connecting a laser facet of the laser die with an embedded waveguide of the phonics die.

18. The laser die and photonics die attachment method of claim 17 further comprising:
   electrically connecting the device side of the photonics die with external circuitry.

* * * * *